(12) United States Patent
Beeley

(10) Patent No.: US 6,198,269 B1
(45) Date of Patent: Mar. 6, 2001

(54) CONVERTER WITH CONTINUOUS CURRENTS FLOWING THROUGH SECONDARY WINDINGS

(75) Inventor: John Ronald Beeley, Hertfordshire (GB)

(73) Assignee: DRS Hadland Ltd., Hertfordshire (GB)

( * ) Notice: Subject to any disclaimer, the term of this patent is extended or adjusted under 35 U.S.C. 154(b) by 0 days.

(21) Appl. No.: 09/319,770

(22) PCT Filed: Dec. 12, 1997

(86) PCT No.: PCT/GB97/03437

§ 371 Date: Sep. 22, 1999

§ 102(e) Date: Sep. 22, 1999

(87) PCT Pub. No.: WO98/26505

PCT Pub. Date: Jun. 18, 1998

(30) Foreign Application Priority Data

Dec. 12, 1996 (GB) .................................................. 9625821

(51) Int. Cl.[7] ........................... H01F 30/12; H03K 17/10
(52) U.S. Cl. ............................................. 323/361; 327/365
(58) Field of Search ............................. 363/60; 307/254, 307/246, 17; 327/365, 392, 181; 323/361

(56) References Cited

U.S. PATENT DOCUMENTS

| 3,636,476 | 1/1972 | Milberger | 332/7 |
|---|---|---|---|
| 3,710,147 | 1/1973 | Lee | 307/246 |
| 3,927,365 | 12/1975 | Kodama et al. | 323/48 |
| 4,301,498 | * 11/1981 | Farrer | 363/17 |
| 5,099,211 | * 3/1992 | Nowak | 324/434 |
| 5,434,456 | 7/1995 | Booth | 307/108 |

FOREIGN PATENT DOCUMENTS 2 632 136    12/1989   (FR) .

* cited by examiner

Primary Examiner—Adolf Deneke Berhane
(74) Attorney, Agent, or Firm—Westman, Champlin & Kelly, P.A.

(57) ABSTRACT

A fast voltage ramp generator comprises a chain of transistors connected collector to emitter in series, and biased to avalanched switching mode. A respective transformer secondary is connected to apply a switching pulse across the base emitter junction of each transistor of the chain to effect avalanche switching of the chain. The transformer secondaries are the secondaries of discrete transformers with respective primaries connected in series. The transformers are formed of ferrite beads having plated through holes constituting the secondaries of the transformers. The beads are threaded on an insulated conductor which constitutes the series connected primaries of the transformers.

48 Claims, 2 Drawing Sheets

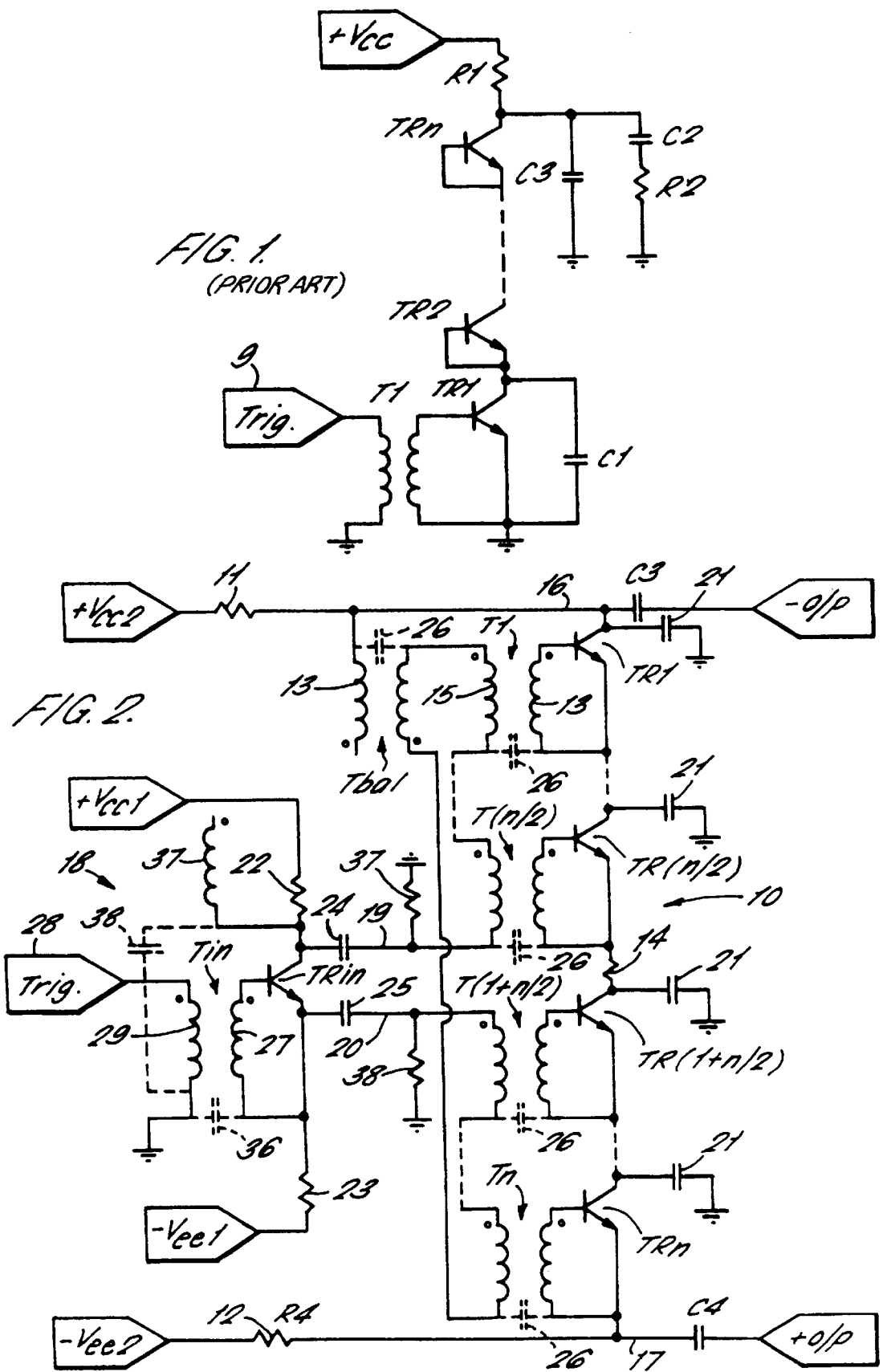

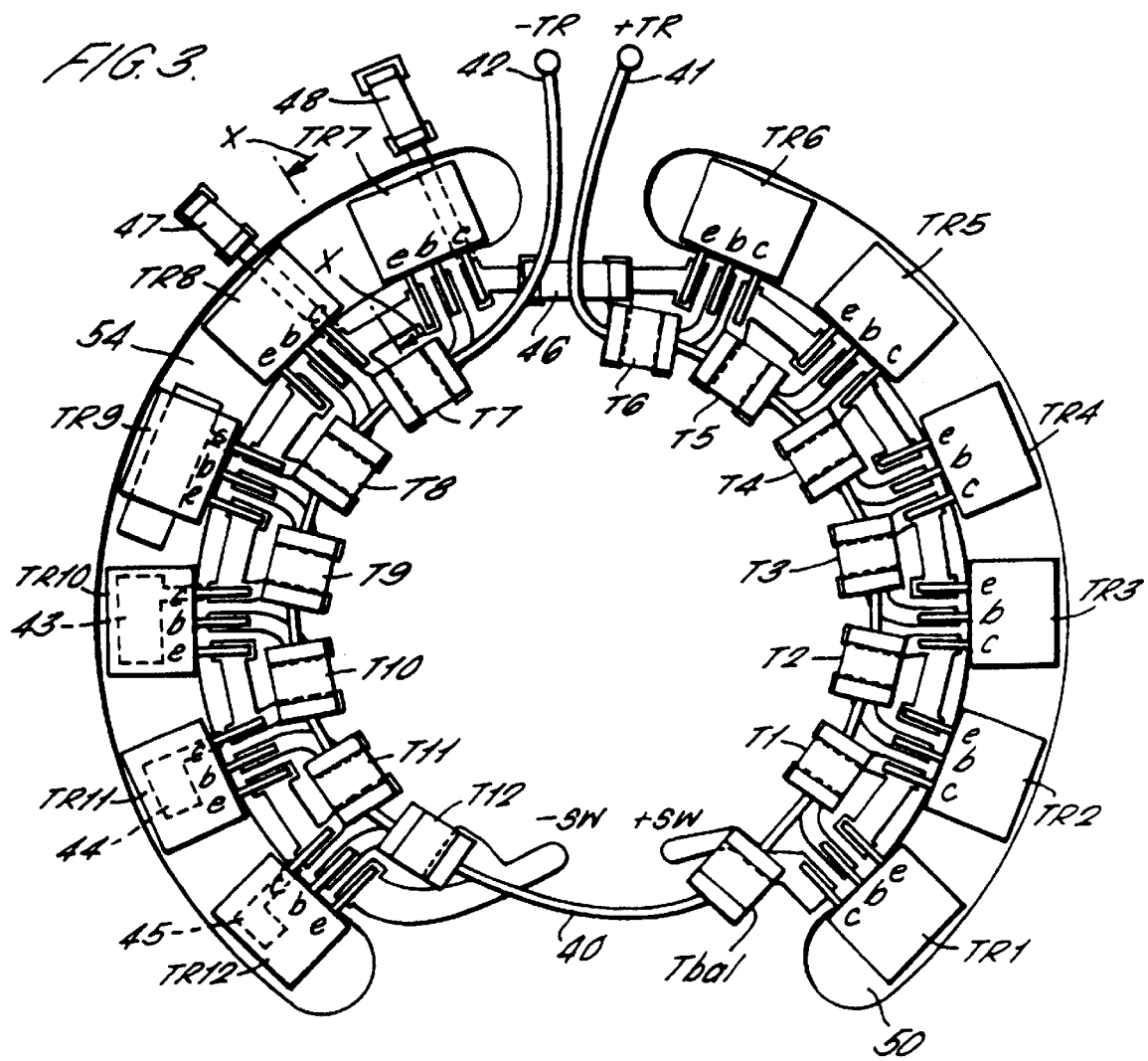
FIG. 3.
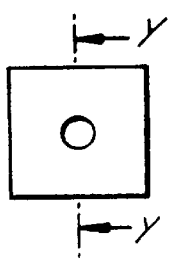
FIG. 4A.
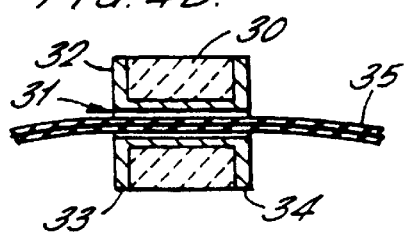
FIG. 4B.
FIG. 5.

CONVERTER WITH CONTINUOUS CURRENTS FLOWING THROUGH SECONDARY WINDINGS

BACKGROUND OF THE INVENTION

The present invention is concerned with fast voltage ramp generators and particularly voltage ramps of nano-second and sub-nano-second duration.

One application of such very fast voltage ramps is in the drive to the sweep plates of single shot streak image converter tube cameras.

Hitherto, the sweep plates of a known prior art streak camera have been driven from a chain of avalanche transistors typically connected in series. One transistor of the chain would be triggered into avalanche switching by applying a positive going voltage pulse to the base of the transistor. The remaining transistors of the chain would then slave trigger from the resultant step voltage transient across them.

The extreme rapidity of the avalanche action, together with the difficulty of matching a high voltage switching ramp for display on an oscilloscope, make it almost impossible to monitor the waveforms of the switching processes in such transistor chains by conventional means. However, studying the performance of a streak camera containing such switching chains suggests that the voltage transients produced are non-uniform in nature and cause jitter in the resulting streak camera timing over femto-second timing intervals.

FIG. 1 illustrates a prior art switching chain used for producing a high speed ramp to drive the sweep plates of a streak camera. The chain comprises a chain TR1 to TRn of small signal high gain—bandwidth product NPN avalanche transistors. The triggering input 9 to the circuit is coupled by means of a transformer T1 to the base-emitter junction of the transistor TR1 at the bottom of the chain. The bases and emitters of the other transistors TR2 to TRn are connected together.

To minimise triggering delay, it is known to operate such a chain of avalanche transistors static biased to the collector-base breakdown voltage of the transistors. Thus, the voltage applied across the chain ($+V_{cc}$) should exceed the sum of the collector-base breakdown voltages of the transistors TR1 to TRn of the chain. A resistor R1 regulates the quiescent breakdown current of the chain to a value below that which would cause avalanche switching of the transistors of the chain. Avalanche switching of any of the transistors which have base and emitter terminals effectively connected together would arise if the collector-base breakdown current of the transistor exceeded a value at which the voltage drop across the intrinsic base-emitter resistance of the transistor causes the emitter-base junction to become forward biased.

With the chain of transistors operating in the above described mode, the whole chain can be avalanche switched by the application of a forward biasing current pulse to the bottom most transistor TR1 of the chain via a triggering transformer T1.

A capacitance C1 across the transistor TR1 ensures this transistor is capacitively loaded. If an avalanche transistor is only resistively loaded, on triggering, the collector voltage of the transistor switches only from its collector-base breakdown voltage to a value near its collector-emitter breakdown voltage. These two voltages can be relatively close so that the effect of switching is a small change of voltage. However, if the transistor is capacitively loaded, sufficient current is available from the capacitor on avalanche switching of the transistor to cause the transistor to saturate so that the collector voltage of the transistor drops from the collector-base breakdown voltage, typically 130 volts, to the collector-emitter saturation voltage, typically about 1 volt.

Accordingly, on triggering of the transistor TR1, the presence of capacitor C1 causes the collector of this transistor to change rapidly between the above two voltages, producing a negative voltage transient of typically 130 volts applied to the emitter of the next transistor TR2 of the chain, and which then propagates up the chain to the emitter of the uppermost transistor TRn. The negative voltage transient initiates the avalanche multiplication process in the base region of each transistor as the emitter of the transistor receives the negative transient. If all the transistors are well matched, the triggering times for each transistor are very similar, probably to within a few pico-seconds. When the voltage transient reaches the emitter of the uppermost transistor TRn, this transistor is capacitively loaded by capacitance C3 so that TRn can also saturate. The resulting avalanche collector current through transistor TRn propagates back down the chain towards TR1.

The avalanche action that has been initiated in each of the devices TR2 to TR(n−1) is initially primarily resistively loaded so that these transistors initially switch only between the collector-base breakdown voltage and the collector-emitter breakdown voltage for each transistor. However, the transistors near the top of the chain may see sufficient charge stored in the stray capacitance to provide sufficient current to saturate the transistor as it performs avalanche switching. In essence, while TR2 and the transistors near the bottom of the chain will probably switch with relatively small changes in collector voltage, the transistors at the top of the chain will be more likely to switch to the saturation voltage levels, i.e. with large voltage excursions. Thus, when the relatively large current transient initiated by switching of transistor TRn starts to travel down the chain, most of the other transistors will have already performed their switching but in some cases to the saturation voltage level and in other cases only to the collector-emitter breakdown voltage level. Where the downwardly travelling current transient comes to a transistor which has hitherto switched only to the collector-emitter breakdown voltage level further time will be required to complete the further switching of that transistor, under the influence of the current transient, to the saturation voltage level.

The effect may be the production of small, random perturbations in the voltage gradient at the collector of the uppermost transistor TRn. In practice, when ramp generators of the kind described above with reference to FIG. 1 are used to drive the deflection plates of an image converter tube used for streak recording, shortcomings have been observed such as shot-to-shot jitter, out of focus and/or distorted images at higher streak writing rates, and considerable loss of ramp linearity, particularly over the initial parts of the ramp which would otherwise be the fastest, most useful sections. These shortcomings can be explained by the above indeterminate sequence of conduction switching in the transistors of the chain.

In the prior art circuit of FIG. 1, C2 represents the overall capacitive circuit load for the ramp generator and resistor R2 is a limiting resistor required to limit the switched current to a safe value to prevent damage to the switching transistors. In practice, the illustrated additional capacitor C3 which is provided to assist the start up of avalanche conduction may be dispensed with since sufficient capacitance may be provided by stray capacitances to ground.

It has also been observed that if the load capacitance C2 is too great and/or the limiting resistor R2 is too small, the first device in the prior art chain of transistors to be damaged is always TR2, followed sequentially by TR3, TR4 etc. This may be explained by considering the effects of the load current transient descending from the uppermost transistor TRn on the other transistors which may be in various conduction modes. When the current surge reaches TR1, this transistor is already close to short circuit. Classical transmission line theory would suggest that the effect of the current transient encountering such a short circuit would be to cause the instantaneous current conducted by TR2 to be nearly twice the incident current value of the propagating transient. If transistor TR2 has at this time performed only a small collector voltage type switching, i.e. to the collector-emitter breakdown voltage, the instantaneous power dissipation in the device would destroy the device unless the current transient is substantially limited by providing a sufficiently high value for resistance R2.

In view of the above, existing practices, as illustrated in the circuit of FIG. 1, in the production of very fast voltage ramps particularly for the sweep plates of streak image converter tube cameras, have provided unreliable timing performance at high streak rates and required relatively low capacitance and high resistance load to avoid damage to the switching transistors.

SUMMARY OF THE INVENTION

According to the present invention, a fast voltage ramp generator comprises a chain of transistors in avalanche switching mode connected collector to emitter in series, each said transistor being connected to have a low resistance path between its base and emitter, a voltage source connected across said chain between the collector of a transistor at one end of the chain and the emitter of a transistor at the other end of the chain, and arranged to bias said transistors to avalanche switching mode, and a transformer having a secondary connected to apply a switching pulse across the base-emitter junction of one of the transistors of the chain to initiate avalanche switching of the transistors of the chain to generate a fast ramp voltage across the load, characterised in that a respective transformer secondary is connected to apply a switching pulse across the base-emitter junction of each transistor of the chain.

With this arrangement, all the transistors in the chain are triggered substantially simultaneously, thereby mitigating or avoiding the above mentioned problems of the prior art.

Preferably, said voltage source has a value to bias each transistor of said chain into collector-base breakdown and includes a series resistance to limit the breakdown current through the chain of transistors to a quiescent value below the current at which avalanche switching occurs.

Preferably, each of said transformer secondaries have sufficient capacitance to load the collector of the next transistor of the chain to allow that transistor to saturate when switched. In this way, when the transistors of the chain are substantially simultaneously switched, they are all switched to the low voltage state, i.e. to the state in which the collector-emitter voltage is substantially the saturation voltage.

Preferably, the respective transformer secondaries are the secondaries of discrete transformers having respective primaries which are connected in series.

In a preferred embodiment each of said transformers comprises a ferrite bead having a plated through hole constituting the secondary of the transformer and an insulated conductor threaded through the hole constituting the primary. Then, the ferrite beads of the transformer may be threaded on a single insulated conductor forming said series connected primaries.

The transformers and the associated avalanche transistors are preferably arranged physically in a circle. This provides a compact arrangement whilst maximising the diametric separation of devices which are separated along the length of the chain.

In a further preferred embodiment, said voltage source connected across said chain is a balanced source, and the generator includes a switching pulse driver connected to apply a balanced switching pulse voltage across said series connected transformer primaries, wherein the transformers having primaries directly connected to said driver, at opposite ends of said series connected primaries, are associated with two central transistors at or adjacent the centre of said chain, the transformers having primaries connected to said end primaries are associated with the next transistors outwards from said central transistors, and so on, so that two transformers having primaries at or adjacent to the centre of said series connected primaries are associated with the end transistors of the chain. In this way, leads connecting the switching pulse voltage to the opposite ends of the series connected primaries can be located near points where the quiescent DC voltage (before switching) along the chain of transistors is close to ground potential and where transient voltages induced from the chain of transistors back towards the switching pulse driver tend to cancel each other out. Also, it takes a finite time for the switching pulse voltage transients applied to the series connected primaries to propagate inwards from opposite ends of the series connected primaries. As a result, the transistors in the central part of the chain will have received their switching pulse voltage signals before the transistors at the ends of the chain. This ensures that the load current transient that subsequently propagates inwards from the ends of the chain of transistors can pass regularly through transistor devices which are already in saturation conduction and then cancel each other halfway along the chain of transistors.

Preferably, the generator includes a switching pulse driver connected to apply a switching pulse voltage across said series connected transformer primaries, wherein said driver comprises a driver avalanche transistor having its collector-emitter circuit capacitively coupled across said series connected transformer primaries, a triggering transformer having a secondary connected to provide a low resistance path between the base and emitter of said driver transformer, a drive voltage source connected across the collector and emitter of the driver transistor and having a value exceeding the collector-base breakdown voltage of said driver transistor, a resistance in series with said drive voltage source to limit the collector-base breakdown current through the driver transistor to a quiescent value below the current at which avalanche switching of the driver transistor occurs, and a triggering pulse source, the triggering transformer having a primary connected to receive a triggering pulse from said source to trigger the driver transistor into avalanche switching.

In a convenient construction, the generator includes a printed circuit board (PCB) having printed contact pads for the terminals of said avalanche transistors of said chain, each said transistor being contained in an E-line package, said PCB having a well, milled part way through the thickness of the board, receiving each said E-line package with the terminals of the transistor extending parallel to the plane of the PCB so as to overlie the respective said printed contact pads. In this way, the transistors can be mounted on the PCB with the terminal leads of the transistor cropped short and minimum distance between the point of soldered contact between each of the leads and the respective printed circuit pad.

Conveniently, a plurality of said E-line packages are located in a common said well. The or each said well may be filled with encapsulation material around the respective E-line package contained therein.

BRIEF DESCRIPTION OF THE DRAWINGS

FIG. 1 is a circuit diagram illustrating a prior art switching chain.

FIG. 2 is a circuit diagram illustrating an embodiment of the present invention;

FIG. 3 is a plan view of the transistor chain and switching transformer arrangement as mounted on a printed circuit board;

FIGS. 4A and 4B are an end view and cross-sectional view respectively illustrating the form of transformer used in the embodiment illustrated in FIG. 3; and FIG. 5 is a cross-sectional view taken along the line X—X of FIG. 2 illustrating the mounting of the transistors of the chain.

DETAILED DESCRIPTION OF THE PREFERRED EMBODIMENTS

Referring to FIG. 2, a chain 10 of series connected avalanche transistors is shown. The collector of the uppermost transistor, identified TR1, is connected to a positive voltage source $+V_{cc2}$ via a resistance 11, and the emitter of the lowermost transistor, identified as TRn, is connected via a resistance 12 to a negative voltage source $-V_{ee2}$. The remaining transistors of the chain 10 are connected emitter to collector directly, as shown, except that the emitter of $TR_{n/2}$ is connected to the collector of $TR_{1+n/2}$ via a resistance 14.

The base of each of the transistors of the chain 10 is connected to the emitter of the respective transistor by means of the secondary 13 of a respective transformer. The transformer associated with the topmost transistor TR1 is identified as transformer T1 and the transformer for the lowermost transistor TRn is identified Tn.

The transformer secondaries 13 provide a low resistance path between the base and emitter of the respective transistor.

Each of the transformers has a primary 15 and all these transformer primaries are connected in series as illustrated. Thus, a current pulse can be driven substantially simultaneously through all the primaries 15 of the transformers T1 to Tn.

The voltage sources $+V_{cc2}$ and $-V_{ee2}$ provide a balanced source of sufficient potential difference to exceed the sum of the collector-base breakdown voltages of all the transistors of the chain 10. Thus, all the transistors of the chain 10 are driven into the collector-base breakdown region. However, the resistors 11 and 12 are chosen to limit the breakdown current flowing through the devices to less than that which would produce in any one transistor a voltage drop across the intrinsic base-emitter resistance of the device sufficient to switch the device into avalanche conduction. Thus, in this quiescent state, the collector-emitter voltage across each transistor of the chain 10 remains substantially at the collector-base breakdown voltage.

In the case of 12 transistors in the chain 10, with a nominal collector-base breakdown voltage of 130 volts, the resulting voltage across the chain 10 between lines 16 and 17 would be 1560 volts. A switching pulse driver indicated generally at 18 is arranged to produce a balanced switching voltage transient across the series connected primaries 15 of the transformers 14 via end terminals 19 and 20.

The switching pulse driver 18 comprises an avalanche transistor TRin having a collector connected via a resistance 22 to a positive drive voltage source $+V_{cc1}$, and its emitter connected via a resistance 23 to a negative drive voltage source $-V_{ee1}$. The values of the drive voltage sources $+V_{cc1}$ and $-V_{ee1}$ are selected to exceed the collector-base breakdown voltage of the transistor TRin. However, the resistances 22 and 23 ensure the quiescent breakdown current through the transistor TRin is insufficient to bias the intrinsic base-emitter resistance of the transistor TRin to the forward bias voltage of the junction. Thus, in the quiescent state, transistor TRin remains in the collector-base breakdown region so that the voltage between the emitter and collector of the transistor TRin corresponds to the collector-base breakdown voltage, typically 130 volts.

The collector of the transistor TRin is connected via a capacitance 24 to one end terminal 19 of the series connected primaries of the transformers T1 to Tn, and the emitter of the transistor TRin is connected via a capacitance 25 to the other end terminal 20. The terminals 19 and 20 are each connected to ground by a respective resistance 37 and 38 to provide a balanced DC return for capacitances 24 and 25.

A triggering transformer Tin has a secondary 27 connected to provide a low resistance path between the base and the emitter of the transistor TRin. An input triggering signal is supplied from a source 28 to the primary 29 of the transformer Tin.

In operation, a triggering pulse applied from the source 28 to the primary 29 of the transformer Tin supplies sufficient voltage bias to the base emitter junction of the transistor TRin to cause avalanche switching of the transistor. Because the transistor TRin is capacitively loaded, by the capacitors 24 and 25 and the distributed capacitance of transformer Tin, sufficient current is available on switching of the transistor TRin to saturate the transistor so that the collector emitter voltage of the transistor drops quickly from the collector-base breakdown voltage to a very low value, typically 1 volt. This voltage transient is applied across the series connected primaries 15 of the transformers T1 to Tn. All the transformers T1 to Tn are connected in the same polarity so that the voltage transient produces correspondingly sufficient forward voltage at the base of each of the transistors of the chain 10 to initiate avalanche switching of these transistors.

In the preferred example, the transformers T1 to Tn have sufficient distributed capacity so as effectively to capacitively load the adjacent transistor of the chain 10. Thus there is sufficient capacity in the secondary 13 of the upper transformer T1 to capacitively load the next lower transistor of the chain 10 (TR2 . As a result, each of the transistors of the chain 10 switch directly to the saturation condition, i.e. with a relatively low voltage across the collector/emitter of the transistor.

The upper transistor TR1, is clearly capacitively loaded by the load capacitance to which the ramp generator is to be connected.

On switching of the transistors of the chain 10, the voltage between the rails 16 and 17 very quickly drops from the previous value, typically 1560 volts to a very low value, say 12 volts and this large fast voltage transient is used to provide the required fast ramp.

As can be seen in the example illustrated in FIG. 2, the primaries 15 of the transformers T1 to Tn are connected in series so that the end terminals 19 and 20 of the series connected primaries are connected directly to the primaries of the transformers associated with the central pair of transistors of the chain 10, that is the transistors identified $TR_{(n/2)}$ and $TR_{(1+n/2)}$. With this arrangement, the end terminals 19 and 20 to the series connected primaries 15 of the transformers 14 can be kept physically well away from the portions of the circuit which may be at relatively high quiescent voltage. Importantly also, in view of the very short duration of the drive transient supplied to the series connected primaries 15, there will be a finite time difference between the initiation of avalanche switching in the central transistors $TR_{(n2)}$ and $TR_{(1+n2)}$ and switching of the uppermost and lowermost transistors TR1 and TRn. On the other hand, the pulse of current which must flow down the transistor chain from the line 16 and up the chain from the line 17 on completion of switching will be initiated only when the upper and lowermost transistors have switched. Thus, the arrangement illustrated ensures that all intermediate transistors of the chain have fully switched when the current pulses travel along the chain to cancel at the centre.

FIG. 3 illustrates the physical layout of the chain 10 of transistors from FIG. 2 and their associated transformers T1 to Tn. In FIG. 3, there are twelve transistors and associated transformers in the chain. The topmost transistor in the chain, is also identified as TR1, so that the transistor in FIG. 3 corresponding to the lowermost transistor in the chain 10 of FIG. 2 is that identified TR12 in FIG. 3. The associated transformers are designated T1 to T12 in FIG. 3.

As can be seen in FIG. 3, the transistors TR1 to TR12 of the chain are physically arranged in a circular array with the associated transformers T1 to T12 arranged in a corresponding circular array inside the array of transistors.

Each of the transformers T1 to T12 is a transmission line transformer fabricated from a small ferrite bead with an electrically conductive through plated hole. FIG. 4A illustrates one such ferrite bead from one end. The bead may have square cros-section as illustrated. FIG. 4B illustrates an axial section through the bead along line Y—Y of FIG. 4A. As can be seen the ferrite bead 30 has a through hole 31. A layer of conductive material 32 extends completely through the hole 31 on the inside of the bead and also covers the ends of the bead providing substantial contact areas 33 and 34 on the outer periphery of the bead at each end. The plated through layer 32 between contact surfaces 33 and 34 constitutes the secondary of the transformer formed by the bead. A primary of the transformer is provided by an insulated conductor 35 threaded through the bead. The conductor 35 may be PTFE insulated.

Referring again to FIG. 3, each of transformers T1 to T12 is surface mounted on corresponding conductive pads provided on a printed circuit board supporting the circuit of the ramp generator. As can be seen in the drawing, printed circuit tracks extend between the collector of one transistor and the emitter of the next transistor. One end of the transformer bead of transformer T1 is mounted on a conductive pad connected to the base of transistor TR1, and the other end of the transformer bead T1 is on a conductive pad connected to the collector of transistor TR2, and hence also to the emitter of transistor TR1. Transformer beads T2 to T12 are similarly connected between the base and emitter of respective ones of transistors TR2 to TR12. The emitter of TR6 is connected to the collector of TR7 via a surface mounted resistor 46, corresponding to the resistance 14 of FIG. 2.

All the transformer beads T1 to T12 have a continuous insulated conductor 40 threaded through them and the conductor 40 thereby provides the series connected primaries of the transformers.

In the illustrated example, TR1 corresponds to the uppermost transistor of the chain and has its collector connected via a conductive track on the printed circuit board to a terminal point +SW corresponding to line 16 in FIG. 2. The emitter of transistor TR12 is connected similarly to a contact point −SW corresponding to the line 17 in FIG. 2. The continuous insulated conductor 40 has one end 41 connected to a contact point on the printed circuit board +TR and the other end 42 connected to a contact point −TR. Thus the contact points +TR and −TR correspond to end terminals 19 and 20 of FIG. 2. As can be seen, the first transformer from contact point +TR through which the insulated conductor 40 is threaded is T6, associated with transistor TR6, and the last transformer through which the conductor is threaded is T7, associated with TR7.

The transistors TR1 to TR12 illustrated in FIG. 3 are contained in E-line packages which have the three terminals of the transistor emerging from the package in a line.

FIG. 5 is a cross-sectional view through the printed circuit board of FIG. 3 taken along line X—X, and illustrates how each transistor is mounted on the board.

A well 54 is milled about halfway through the thickness of the printed circuit board to receive the transistor 51 lying on its side as illustrated in FIG. 5. The well 54 is arranged to be just deep enough so as to receive the transistor and allow the leads 52 of the transistor 51 to overlie the printed circuit connection pads 53 of the printed circuit board, without any substantial bending of the leads. In this way, connections may be made to the transistor leads at positions very close to the entry points of the leads to the body of the transistor 51.

In practice, as can be seen in FIG. 3, a single well 50 in the shape of a circular arc is provided to receive all of transistors TR1 to TR6 and a second well 54 is provided to receive the transistors TR7 to TR12. Once all transistors have been mounted and soldered in position, the remaining volume of the wells 50 and 54 can be filled with an encapsulating material 55 as illustrated in FIG. 5.

Although this method of mounting E-line type transistor packages on a printed circuit board is described herein in relation to its application in a fast voltage ramp generator, it will be understood that this technique may be used in any other circuit in which E-line transistor packages are to be mounted on a printed circuit board. The present invention may be envisaged to encompass these other arrangements also.

In order to minimise ringing at the outputs on triggering of the circuit described above, it is important to match the various effective transmission lines existing in the circuit. The circuit of FIG. 2 may be regarded as a pair of identical circuits of opposed polarity. Thus, in the upper part of the circuit (transistors TR1 to $TR_{n/2}$) switching results in a positive current pulse propagating down the transmission line formed by transistors TR1 to $TR_{n/2}$. Similarly, in the lower part of the circuit (transistors $TR_{1+n/2}$ to TRn) on switching a negative current pulse propagates up from TRn to $TR_{1+n/2}$. In transition line terms, the upper and lower transmission lines appear to a propagating pulse to be grounded at the junction between the two halves of the circuit, i.e. between transistor $TR_{n/2}$ and transistor $TR_{1+n/2}$.

Resistance 14 (FIG. 2) is connected in series between $TR_{n/2}$ and $TR_{1+n/2}$ in order to provide matching termination for the upper and lower transmission lines. If the characteristic impedance of the upper and lower lines, selected to match the source impedance for the respective current pulses entering the transmission lines, is $Z_0$, then the value of resistance 14 should preferably be about $2Z_0$.

It may also be observed that the transistors TR1 to TRn exhibit, during the dynamics of avalanche switching, an effective negative capacitance. This negative capacitance is caused by stored electric charges within the semiconductor junction regions as these regions change substantially in thickness during is avalanche switching. The effect is similar to a positive inductance within each transistor. In order to trim out this negative capacitance and to provide the required characteristic impedance along the transmission line formed by the series connected avalanche transistors, a small value trimming capacitance 21 is connected between the collector of each of transistors TR1 to TRn and ground. The capacitances 21 may be graded to provide the desired characteristic impedance with the capacitances 21 nearest the centre of the transistor chain (the ends of the respective upper and lower transmission lines) having the highest values, and the capacitances at the upper and lower transistors TR1 and TRn having the lowest values.

It will be appreciated that each of the transformers T1 to Tn have an effective capacitance linking their respective primaries and secondaries. These capacitances are illustrated in dotted outline in FIG. 2 as capacitors 26. In a typical installation, such as illustrated in FIG. 3, the chain 10 of avalanche transistors is formed of a total of 12 transistors. The applied voltage source $+V_{cc2}$ is +780 volts, and the voltage source $-V_{ee2}$ is -780 volts. Thus, the voltage across the collector emitter terminals of each transistor in the chain, before switching, is 130 volts.

On switching, therefore, the emitter of transistor TR1 sees a negative going voltage edge from 650 to zero volts, i.e. an edge of -650 volts which may be transmitted through the capacitance 26 from the secondary 13 to the primary 15 of the associated transformer T1. A similar excursion of the opposite polarity (+650 volts) is seen by the emitter of transistor TR11, which may in turn be transmitted via the capacitance 26 to the primary of the transformer T11. Since all the primaries of the transformers are connected together in series, the voltage pulse transmitted by transformer T1 should cancel out the voltage pulse transmitted by transformer T11.

It should be noted here that the voltage pulse transmitted by transformer T12 by its capacitance 26, will be greater, since the emitter of transistor TR12 goes from -780 volts to zero volts on switching of the circuit.

Considering next transistor TR2, its emitter will see a negative going voltage change on switching of 520 volts and the effect of this transmitted via the capacitance of transformer T2 should be cancelled by the opposite polarity excursion of the emitter of transistor 10.

In a similar fashion, the voltage excursion of the transistors of the upper part of the circuit are cancelled by those of the lower part, when transmitted to the series connected primaries of the transformers, with the voltage excursion of 130 volts for the emitter of TR7 in the lower part of the circuit, being cancelled by the opposite polarity excursion of the emitter of TR5.

It may be noted that the emitter of TR6 is effectively at ground potential both before and after switching and so experiences no substantial excursion.

It can be seen, therefore, that the only excursion which is not cancelled when the circuit of FIG. 2 switches is that of the emitter of the lowermost transistor TRn (TR12 in the above example). The excursion of the emitter of this lowermost transistor is equal to the negative line voltage $-V_{ee2}$ (780 volts in the above example). This positive going excursion on switching is communicated by the capacitance 26 of the transformer Tn (T12 in the example) to the series connected primaries. The effect of this is an imbalance in the loading of the upper and lower parts of the chain of avalanche transistors, with the lowermost transistor TRn being required to conduct the discharge current of the capacitance 26 of the associated transformer Tn, whereas the capacitances of all the other transformers effectively cancel each other out.

In order to cancel out also the capacitance 26 of the lowermost transformer Tn, an additional capacitance may be connected between the series connected primaries of the transformers and the line 16 which is connected to the collector of the uppermost transistor TR1. Then on switching of the circuit, a corresponding negative going voltage change of -780 volts is communicated through this additional capacitance to the series connected primaries. So long as the additional capacitance matches the capacitance 26 of the transformers T1 to Tn (which should all be themselves closely matched), the additional capacitance will cancel out the effect of the capacitance of transformer Tn.

A very convenient way of providing the required additional capacitance is to connect the primary of an additional balancing transformer Tbal in series with the primaries 15 of transformers T1 to Tn. The secondary 13 of the additional transformer Tbal may then have one terminal connected to the line 16. The other terminal of the secondary may be left floating. If the transformer Tbal is matched to the transformers T1 to Tn, then this arrangement will provide a corresponding capacitance 26 between the line 16 and the series connected primaries of the transformers, as required effectively to cancel out the capacitance 26 of the transformer Tn.

Referring to FIG. 3, the additional transformer may comprise a ferrite bead identical to those of transformers T1 to T12 and also threaded on the insulating conductor 40 which forms the series connected primaries of the various transformers. As shown in FIG. 3, one end only of the transformer bead may then be surface mounted to the conductor pad on the printed circuit connected to the collector of transistor TR1.

Referring again to FIG. 2, the primary 29 and secondary 27 of the triggering transformer Tin may also be regarded as being interconnected by a capacitance 36. As a result, the emitter of the driver transistor TRin is connected by the capacitance 36 to ground. This can produce an imbalance in the drive voltages generated by the driver transistor TRin and communicated via the capacitances 24 and 25 to the ends of the series connected primaries. This imbalance in the drive signals produced by the driver transistor TRin may be counteracted by providing a capacitance of the same value as capacitance 36, between the collector of driver transistor TRin and ground. A convenient method of providing this capacitance is to form triggering transformer Tin with an additional secondary winding 37. The secondary windings 27 and 37 of transformer Tin are arranged to have the same capacitance with the primary winding 29 of the transformer. Additional secondary winding 37 then has one terminal connected to the collector of the driving transformer TRin. The other terminal may be left unconnected. In this way, a balancing capacitance 38 is provided having the same value as capacitance 36.

Referring now again to FIGS. 3 and 5, these illustrate a convenient method of providing the trimming capacitances 21 connected to the collectors of the avalanche transistors in the chain. The metallisation of the contact pad for the collector of each of transistors TR1 to TR12 may be extended into the respective well 50 or 54 to form a plate region as illustrated at 43, 44 and 45 for example under transistors TR10, TR11 and TR12 in FIG. 3. At the same time, a ground plane metallisation 46 is formed on the underneath face of the PCB, at least under the wells 50 and 54, so that the plate regions 43 to 45 form, with the ground plane 46, respective capacitors. The size of the plate region 43, 44 and 45 may be selected to provide the desired value of capacitance according to the position of the respective transistor in the chain. If capacitance values are required which are larger than those that can be made with the above method, the metallisation from the collector pad of the respective transistor may be continued through the well to the outer side of the well to provide surface mount pads for discrete surface mounted trimming capacitances, such as illustrated at 47 and 48 in FIG. 3.

In FIG. 3, the corresponding capacitances for transistors TR1 to TR6 have been omitted for clarity.

The capacitance values required to achieve the desired matching of the characteristic impedance are graded, with the lowest value capacitance being connected to the transistors TR1 and TR12 at the ends of the chain, and the highest value capacitances connected to the transistors TR6 and TR7 at the centre of the chain. It should be appreciated that the capacitances for the transistors TR1 to TR6 should therefore be a mirror image of those shown for transistors TR12 to TR7.

In the above description transistors in avalanche switching mode are sometimes referred to as avalanche transistors, but it will be understood that any transistor (normally NPN junction types) which can operate in avalanche switching mode when suitably biased is to be covered by this term.

Also a particular form of avalanche switching is described in which the transistor is biased to collector-base breakdown with insufficient breakdown current to initiate avalanche switching. This is a preferred form which is desirably fast. However the transistors for this form of operation must be selected to be stable in collector-base breakdown condition without spontaneous avalanche breakdown. The invention may be used with the other forms of avalanche switching, e.g. where the transistors are individually biased to below the collector-base breakdown voltage.

It should be understood also that the described invention may be used with any appropriate load and is not limited to driving the sweep plates of a streak camera. Some capacitance in the load is essential to ensure the transistors, especially those at the ends of the chain, saturate on avalanche switching, but unavoidable stray capacitance may often be sufficient for this purpose unless fully compensated by load inductance.

What is claimed is:

1. A fast voltage ramp generator comprising a chain of transistors in avalanche switching mode connected collector to emitter in series, each said transistor being connected to have a low resistance path between its base and emitter, a voltage source connected across said chain between the collector of a transistor at one end of the chain and the emitter of a transistor at the other end of the chain and arranged to bias said transistors to avalanche switching mode, and a discrete transformer having a respective secondary connected to apply a switching pulse across the base-emitter junction of each of the transistors of the chain to initiate avalanche switching of the transistors of the chain to generate a fast ramp voltage across the load, said transformers having respective primaries which are connected in series, wherein each of said transformers comprises a ferrite bead having a plated through hole constituting the secondary of the transformer and an insulated conductor threaded through the hole constituting the primary.

2. A ramp generator as claimed in claim 1, wherein said voltage source has a value to bias each transistor of said chain into collector-base breakdown and includes a series resistance to limit the breakdown current through the chain of transistors to a quiescent value below the current at which avalanche switching occurs.

3. A ramp generator as claimed in claim 1, wherein each of said transformer secondaries has sufficient capacitance to load the collector of the next transistor of the chain to allow that transistor to saturate when switched.

4. A ramp generator as claimed in claim 1, including a series resistance connected between the collector and emitter of at least one adjacent pair of transistors in the chain, to improve impedance matching for a current pulse from the voltage source propagating along the transmission line formed by the chain of transistors following switching.

5. A ramp generator as claimed in claim 1, wherein the ferrite beads of the transformer are threaded on a single insulated conductor forming said series connected primaries.

6. A ramp generator as claimed in claim 1, wherein the transformers and the associated avalanche transistors are arranged physically in a circle.

7. A ramp generator as claimed in claim 1, wherein said voltage source connected across said chain is a balanced source and there are an even number of transistors in said chain and associated discrete transformers, said generator including a switching pulse driver connected to apply a balanced switching pulse voltage across said series connected transformer primaries, wherein the transformers having primaries directly connected to said driver, at opposite ends of said series connected primaries, are associated with two central transistors at or adjacent to the centre of said chain, the transformers having primaries connected next to said end primaries are associated with the next transistors outwards from said central transistors, and so on, so that two transformers having primaries at or adjacent to the centre of said series connected primaries are associated with the end transistors of said chain.

8. A ramp generator as claimed in claim 7, wherein said discrete transformers have matching characteristics and the generator includes a capacitance connected between said collector of the transistor at said one end of the chain and said series connected primaries, said capacitance having a value matching the capacitance between the primary and the secondary of each of the matching discrete transformers.

9. A ramp generator as claimed in claim 8, wherein said capacitance is provided by an additional said matching discrete transformer having a primary connected in series with the primaries of said discrete transformers associated with the chain of transistors and a secondary having at least one secondary terminal connected to said collector of the transistor at said one end of the chain.

10. A ramp generator as claimed in claim 7, including a terminating resistance connected in series between the collector and the emitter of the central adjacent pair of transistors of the chain, to improve impedance matching for current pulses of opposite polarity, propagating in opposite directions from the voltage source to the middle of the chain following switching.

11. A ramp generator as claimed in claim 10, wherein said terminating resistance has a value equal to twice the source impedance for each polarity of the current pulse.

12. A ramp generator as claimed in claim 1, including a switching pulse driver connected to apply a switching pulse voltage across said series connected transformer primaries, wherein said driver comprises a driver avalanche transistor having its collector-emitter circuit capacitively coupled across said series connected transformer primaries, a triggering transformer having a secondary connected to provide a low resistance path between the base and emitter of said driver transformer, a drive voltage source connected across the collector and emitter of said driver transistor and having a value exceeding the collector-base breakdown voltage of said driver transistor, a resistance in series with said drive voltage source to limit the collector-base breakdown current through the driver transistor to a quiescent value below the current at which avalanche switching of the driver transistor occurs, and a triggering pulse source, the triggering transformer having a primary connected to receive a triggering pulse from said source to trigger the driver transistor into avalanche switching.

13. A ramp generator as claimed in claim 12, wherein said drive voltage source is a balanced voltage and equal values of resistance are provided respectively between the collector of the driver transistor and said source and between the emitter of the driver transistor and said source, whereby said switching pulse applied to said series connected primaries is also balanced.

14. A ramp generator as claimed in claim 13, wherein the triggering transformer has a predetermined capacitance between the secondary connected to the emitter of the driver transistor and the primary connected to receive the triggering pulse, and the generator includes a capacitance having a value matching said predetermined capacitance connected between the collector of said driver transistor and said primary of the triggering transformer.

15. A ramp generator as claimed in claim 14, wherein said triggering transformer has an additional secondary with the capacitance between the additional secondary and the primary matching said predetermined capacitance, said additional secondary having at least one secondary terminal connected to the collector of said driver transistor.

16. A ramp generator as claimed in claim 7, wherein said triggering transformer is a ferrite bead having a plated through hole forming the secondary and an insulated conductor threaded through the hole constituting the primary.

17. A ramp generator as claimed in claim 1, including a printed circuit board (PCB) having printed contact pads for the terminals of said avalanche transistors of said chain, each said transistor being contained in an E-line package, said PCB having a well, milled part way through the thickness of the board, receiving each said E-line package with the terminals of the transistor extending parallel to the plane of the PCT so as to overlie the respective said printed contact pads.

18. A ramp generator as claimed in claim 17, wherein a plurality of said E-line packages are located in a common said well.

19. A ramp generator as claimed in claim 17, wherein the or each said well is filled with encapsulation material around the respective E-line package contained therein.

20. A ramp generator as claimed in claim 17, wherein the PCB has a ground plane formed on the reverse side relative to the well at least under the well, and metallisation from the collector contact pad for at least one of the transistors is extended into the well to provide a selected trimming capacitance between the collector of the respective transistor and ground to improve impedance matching of the transmission line formed by the chain of transistors.

21. A fast voltage ramp generator comprising a chain of transistors in avalanche switching mode connected collector to emitter in series, each said transistor being connected to have a low resistance path between its base and emitter, a voltage source connected across said chain between the collector of a transistor at one end of the chain and the emitter of a transistor at the other end of the chain and arranged to bias said transistors to avalanche switching mode, and a discrete transformer having a respective secondary connected to apply a switching pulse across the base-emitter junction of each of the transistors of the chain to initiate avalanche switching of the transistors of the chain to generate a fast ramp voltage across the load, said transformers having respective primaries which are connected in series, wherein said voltage source connected across said chain is a balanced source and there are an even number of transistors in said chain and associated discrete transformers, said generator including a switching pulse driver connected to apply a balanced switching pulse voltage across said series connected transformer primaries, wherein the transformers having primaries directly connected to said driver, at opposite ends of said series connected primaries, are associated with two central transistors at or adjacent to the centre of said chain, the transformers having primaries connected next to said end primaries are associated with the next transistors outwards from said central transistors, and so on, so that two transformers having primaries at or adjacent to the centre of said series connected primaries are associated with the end transistors of said chain.

22. A ramp generator as claimed in claim 21, wherein said discrete transformers have matching characteristics and the generator includes a capacitance connected between said collector of the transistor at said one end of the chain and said series connected primaries, said capacitance having a value matching the capacitance between the primary and the secondary of each of the matching discrete transformers.

23. A ramp generator as claimed in claim 22, wherein said capacitance is provided by an additional said matching discrete transformer having a primary connected in series with the primaries of said discrete transformers associated with the chain of transistors and a secondary having at least one secondary terminal connected to said collector of the transistor at said one end of the chain.

24. A ramp generator as claimed in claim 21, including a terminating resistance connected in series between the collector and the emitter of the central adjacent pair of transistors of the chain, to improve impedance matching for current pulses of opposite polarity, propagating in opposite directions from the voltage source to the middle of the chain following switching.

25. A ramp generator as claimed in claim 24, wherein said terminating resistance has a value equal to twice the source impedance for each polarity of the current pulse.

26. A ramp generator as claimed in claim 21, including a switching pulse driver connected to apply a switching pulse voltage across said series connected transformer primaries, wherein said driver comprises a driver avalanche transistor having its collector-emitter circuit capacitively coupled across said series connected transformer primaries, a triggering transformer having a secondary connected to provide a low resistance path between the base and emitter of said driver transformer, a drive voltage source connected across the collector and emitter of said driver transistor and having a value exceeding the collector-base breakdown voltage of said driver transistor, a resistance in series with said drive voltage source to limit the collector-base breakdown current through the driver transistor to a quiescent value below the current at which avalanche switching of the driver transistor occurs, and a triggering pulse source, the triggering transformer having a primary connected to receive a triggering pulse from said source to trigger the driver transistor into avalanche switching.

27. A ramp generator as claimed in claim 26, wherein said drive voltage source is a balanced voltage and equal values of resistance are provided respectively between the collector of the driver transistor and said source and between the emitter of the driver transistor and said source, whereby said switching pulse applied to said series connected primaries is also balanced.

28. A ramp generator as claimed in claim 27, wherein the triggering transformer has a predetermined capacitance between the secondary connected to the emitter of the driver transistor and the primary connected to receive the triggering pulse, and the generator includes a capacitance having a value matching said predetermined capacitance connected between the collector of said driver transistor and said primary of the triggering transformer.

29. A ramp generator as claimed in claim 28, wherein said triggering transformer has an additional secondary with the capacitance between the additional secondary and the primary matching said predetermined capacitance, said additional secondary having at least one secondary terminal connected to the collector of said driver transistor.

30. A ramp generator as claimed in claim 26, wherein said triggering transformer is a ferrite bead having a plated through hole forming the secondary and an insulated conductor threaded through the hole constituting the primary.

31. A ramp generator as claimed in claim 21, including a printed circuit board (PCB) having printed contact pads for the terminals of said avalanche transistors of said chain, each said transistor being contained in an E-line package, said PCB having a well, milled part way through the thickness of the board, receiving each said E-line package with the terminals of the transistor extending parallel to the plane of the PCT so as to overlie the respective said printed contact pads.

32. A ramp generator as claimed in claim 31, wherein a plurality of said E-line packages are located in a common said well.

33. A ramp generator as claimed in claim 31, wherein the or each said well is filled with encapsulation material around the respective E-line package contained therein.

34. A ramp generator as claimed in claim 31, wherein the PCB has a ground plane formed on the reverse side relative to the well at least under the well, and metallisation from the collector contact pad for at least one of the transistors is extended into the well to provide a selected trimming capacitance between the collector of the respective transistor and ground to improve impedance matching of the transmission line formed by the chain of transistors.

35. A fast voltage ramp generator comprising a chain of transistors in avalanche switching mode connected collector to emitter in series, each said transistor being connected to have a low resistance path between its base and emitter, a voltage source connected across said chain between the collector of a transistor at one end of the chain and the emitter of a transistor at the other end of the chain and arranged to bias said transistors to avalanche switching mode, and at least one transformer having a respective secondary connected to apply a switching pulse across the base-emitter junction of each of the transistors of the chain to initiate avalanche switching of the transistors of the chain to generate a fast ramp voltage across the load, wherein said voltage source connected across said chain is a balanced source and there are an even number of transistors in said chain and associated transformer secondaries, said generator including a terminating resistance connected in series between the collector and the emitter of the central adjacent pair of transistors of the chain, to improve impedance matching for current pulses of opposite polarity, propagating in opposite directions from the voltage source to the middle of the chain following switching.

36. A ramp generator as claimed in claim 35, wherein the respective transformer secondaries are the secondaries of discrete said transformers having respective primaries which are connected in series.

37. A ramp generator as claimed in claim 36, wherein each of said transformers comprises a ferrite bead having a plated through hole constituting the secondary of the transformer and an insulated conductor threaded through the hole constituting the primary.

38. A ramp generator as claimed in claim 37, wherein the ferrite beads of the transformer are threaded on a single insulated conductor forming said series connected primaries.

39. A ramp generator as claimed in claim 35, wherein said terminating resistance has a value equal to twice the source impedance for each polarity of the current pulse.

40. A fast voltage ramp generator comprising a chain of transistors in avalanche switching mode connected collector to emitter in series, each said transistor being connected to have a low resistance path between its base and emitter, a voltage source connected across said chain between the collector of a transistor at one end of the chain and the emitter of a transistor at the other end of the chain and arranged to bias said transistors to avalanche switching mode, and a discrete transformer having a respective secondary connected to apply a switching pulse across the base-emitter junction of each of the transistors of the chain to initiate avalanche switching of the transistors of the chain to generate a fast ramp voltage across the load, said transformers having respective primaries which are connected in series, said generator including a switching pulse driver connected to apply a switching pulse voltage across said series connected transformer primaries, wherein said driver comprises a driver avalanche transistor having its collector-emitter circuit capacitively coupled across said series connected transformer primaries, a triggering transformer having a secondary connected to provide a low resistance path between the base and emitter of said driver transformer, a drive voltage source connected across the collector and emitter of said driver transistor and having a value exceeding the collector-base breakdown voltage of said driver transistor, a resistance in series with said drive voltage source to limit the collector-base breakdown current through the driver transistor to a quiescent value below the current at which avalanche switching of the driver transistor occurs, and a triggering pulse source, the triggering transformer having a primary connected to receive a triggering pulse from said source to trigger the driver transistor into avalanche switching.

41. A ramp generator as claimed in claim 40, wherein said drive voltage source is a balanced voltage and equal values of resistance are provided respectively between the collector of the driver transistor and said source and between the emitter of the driver transistor and said source, whereby said switching pulse applied to said series connected primaries is also balanced.

42. A ramp generator as claimed in claim 41, wherein the triggering transformer has a predetermined capacitance between the secondary connected to the emitter of the driver transistor and the primary connected to receive the triggering pulse, and the generator includes a capacitance having a value matching said predetermined capacitance connected between the collector of said driver transistor and said primary of the triggering transformer.

43. A ramp generator as claimed in claim 42, wherein said triggering transformer has an additional secondary with the capacitance between the additional secondary and the primary matching said predetermined capacitance, said additional secondary having at least one secondary terminal connected to the collector of said driver transistor.

44. A ramp generator as claimed in claim 40, wherein said triggering transformer is a ferrite bead having a plated through hole forming the secondary and an insulated conductor threaded through the hole constituting the primary.

45. A fast voltage ramp generator comprising a chain of transistors in avalanche switching mode connected collector to emitter in series, each said transistor being connected to have a low resistance path between its base and emitter, a voltage source connected across said chain between the collector of a transistor at one end of the chain and the emitter of a transistor at the other end of the chain and arranged to bias said transistors to avalanche switching mode, and at least one transformer having a respective secondary connected to apply a switching pulse across the base-emitter junction of each of the transistors of the chain to initiate avalanche switching of the transistors of the chain to generate a fast ramp voltage across the load, the generator including a printed circuit board (PCB) having printed contact pads for the terminals of said avalanche transistors of said chain, each said transistor being contained in an E-line package, said PCB having a well, milled part way through the thickness of the board, receiving each said E-line package with the terminals of the transistor extending parallel to the plane of the PCB so as to overlie the respective said printed contact pads.

46. A ramp generator as claimed in claim 45, wherein a plurality of said E-line packages are located in a common said well.

47. A ramp generator as claimed in claim 45, wherein the or each said well is filled with encapsulation material around the respective E-line package contained therein.

48. A ramp generator as claimed in claim 45, wherein the PCB has a ground plane formed on the reverse side relative to the well at least under the well, and metallisation from the collector contact pad for at least one of the transistors is extended into the well to provide a selected trimming capacitance between the collector of the respective transistor and ground to improve impedance matching of the transmission line formed by the chain of transistors.

* * * * *

UNITED STATES PATENT AND TRADEMARK OFFICE
CERTIFICATE OF CORRECTION

PATENT NO.    : 6,198,269 B1
DATED         : March 6, 2001
INVENTOR(S)   : John Ronald Beeley It is certified that error appears in the above-identified patent and that said Letters Patent is hereby corrected as shown below:

<u>Title page,</u>
Item [54], the title should be -- HIGH VOLTAGE RAMP GENERATOR --

<u>Column 13,</u>
Line 52, cancel "PCT" and insert -- PCB --.

<u>Column 15,</u>
Line 38, cancel "PCT" and insert -- PCB --.

Signed and Sealed this

Nineteenth Day of March, 2002

Attest:

JAMES E. ROGAN
*Director of the United States Patent and Trademark Office*

*Attesting Officer*